(12) United States Patent
Braun et al.

(10) Patent No.: US 12,008,847 B2
(45) Date of Patent: Jun. 11, 2024

(54) METHOD FOR MONITORING AN ELECTRICAL SYSTEM OF A MOTOR VEHICLE

(71) Applicant: Robert Bosch GmbH, Stuttgart (DE)

(72) Inventors: Lars Braun, Stuttgart (DE); Quang-Minh Le, Hemmingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 384 days.

(21) Appl. No.: 17/477,177

(22) Filed: Sep. 16, 2021

(65) Prior Publication Data
US 2022/0101664 A1 Mar. 31, 2022

(30) Foreign Application Priority Data
Sep. 30, 2020 (DE) .......................... 102020212414.0

(51) Int. Cl.
| | |
|---|---|
| G07C 5/08 | (2006.01) |
| B60R 16/03 | (2006.01) |
| G01R 19/25 | (2006.01) |
| G01R 31/00 | (2006.01) |

(52) U.S. Cl.
CPC ........ *G07C 5/0808* (2013.01); *B60R 16/0307* (2013.01); *G01R 19/25* (2013.01); *G01R 31/007* (2013.01)

(58) Field of Classification Search
CPC .................................................. G07C 5/0808
See application file for complete search history.

(56) References Cited

U.S. PATENT DOCUMENTS

| | | | | |
|---|---|---|---|---|
| 10,345,351 | B2* | 7/2019 | Wortberg | G01R 31/007 |
| 11,361,598 | B2* | 6/2022 | Koller | B60L 58/10 |
| 2021/0285997 | A1* | 9/2021 | Jarmolowitz | B60R 16/033 |
| 2022/0101664 | A1* | 3/2022 | Braun | G01R 19/25 |
| 2023/0366914 | A1* | 11/2023 | Braun | G01R 19/10 |

FOREIGN PATENT DOCUMENTS

| | | |
|---|---|---|
| DE | 102018212369 A1 | 1/2020 |
| DE | 102018212770 A1 | 2/2020 |
| DE | 102018219222 A1 | 5/2020 |
| WO | 2018077658 A1 | 5/2018 |

* cited by examiner

*Primary Examiner* — Michael A Berns
(74) *Attorney, Agent, or Firm* — NORTON ROSE FULBRIGHT US LLP; Gerard A. Messina (57) ABSTRACT

A method for monitoring an electrical system of a motor vehicle. A safety-related electrical consumer and possibly further electrical consumers are supplied by an energy accumulator. At least one model of the vehicle electrical system is provided which represents the safety-related electrical consumer and corresponding lines with associated line resistances and connection to the energy accumulator. The method includes: providing a current or power profile that will likely be necessary for at least for one specific maneuver of the motor vehicle involving the safety-related electrical consumer; determining a predicted characteristic quantity of the energy accumulator utilizing the current or power profile; determining a predicted characteristic quantity of the safety-related electrical consumer utilizing a current profile or power profile expected to be applied to the safety-related electrical consumer, the associated line resistance and the predicted characteristic quantity of the energy accumulator; evaluating the predicted characteristic quantity of the safety-related electrical consumer.

15 Claims, 4 Drawing Sheets

METHOD FOR MONITORING AN ELECTRICAL SYSTEM OF A MOTOR VEHICLE

CROSS REFERENCE

The present application claims the benefit under 35 U.S.C. § 119 of German Patent Application No. DE 102020212414.0 filed on Sep. 30, 2020, which is expressly incorporated herein by reference in its entirety.

FIELD

The present invention relates to a method for monitoring an electrical system of a motor vehicle.

BACKGROUND INFORMATION

PCT Patent Application No. WO 2018/077658 A1 describes a method for monitoring a motor vehicle having automated driving functions, and a device for carrying out the method. In that case, at least one characteristic quantity of an energy accumulator is predicted as a function of at least one of the load profiles, and the operating mode associated with the load profile and/or the automated driving functions is/are enabled, disabled, terminated or influenced depending on the predicted characteristic quantity of the energy accumulator.

German Patent Application No. DE 102018212369 A1 describes a method for monitoring an energy supply in a motor vehicle, where in a partial vehicle electrical system, at least one energy accumulator supplies several, preferably safety-related electrical consumers with energy. At least one measured quantity of an energy accumulator and/or of at least one electrical consumer is acquired, at least one wiring-harness model being provided which represents the partial vehicle electrical system. At least one parameter estimator is provided which estimates at least one characteristic quantity of the wiring-harness model, utilizing the measured quantities.

German Patent Application No. DE 102018219222 A1 describes a method for operating an electric vehicle. In that case, a charging strategy is determined for a battery based on a mechanical trajectory that represents a torque curve for a future operation of the vehicle.

German Patent Application No. DE 102018212770 A1 describes a method for monitoring an electrical system of a motor vehicle. In that case it is checked by simulation, which safe-stop scenario is available under the present condition of the battery and electrical system. In addition, appropriate measures in the vehicle electrical system are proposed, and the analysis of the direct effect of these measures on the availability of the various scenarios is determined.

An object of the present invention is to further increase availability, particularly in the case of vehicle electrical systems with high safety requirements like, for example, in connection with automated driving functions. This objective may be achieved by the features disclosed herein.

SUMMARY

A method according to an example embodiment of the present invention may have the advantage that latent faults, which lead to an undervoltage at a safety-related electrical consumer, are ruled out. The availability of the vehicle electrical system is increased, since individual threshold values of individual components such as a maximum resistance of a line are able to be reduced to uniform threshold values. Individual maneuvers, particularly driving maneuvers, are covered in terms of power. Consequently, a failure of the safety-related electrical consumers because of an undervoltage is ruled out. Moreover, the components of the vehicle electrical system such as an energy accumulator, for example, may be dimensioned smaller, since a more pinpointed, corresponding prediction of a characteristic quantity of the safety-related electrical consumer becomes possible.

In one expedient further development of the present invention, in the event the predicted characteristic quantity drops below a limit value, enabling of the maneuver is denied and/or the maneuver is adjusted and/or corresponding information concerning the feasibility of the maneuver is generated. In this way, critical maneuvers may be ruled out, or only those maneuvers are allowed which are not risky. The availability of the vehicle thus increases.

In one useful further development of the present invention, the following step is provided: Receiving a current profile and/or power profile requested by a vehicle control for the specific maneuver, processing the requested current profile and/or power profile to obtain the current profile or power profile to be provided by the energy accumulator and/or to obtain a current profile for each line which supplies a safety-related electrical consumer involved in the maneuver. Consequently, the maneuvers requested in each case by the vehicle control may be converted in pinpointed fashion into corresponding current profiles for the actual electrical consumers installed in the specific vehicle electrical system. Uniform interfaces between the vehicle control and the electrical-system monitoring are able to be defined.

In one further development of the present invention, at least one model of the safety-related electrical consumer is provided, via which a current profile or power profile of the safety-related electrical consumer is assessed, particularly in the case of different maneuvers. Various situations may thereby be considered particularly easily via a corresponding current profile. Flexibility is further increased.

In one expedient further development of the present invention, the current profile or power profile is determined as a function of a status of the electrical consumer. In particular, present base loads of electrical consumers not related to safety may initially be taken into account in assessing a specific maneuver, and if necessary, countermeasures may first be carried out at a later point in time. Accuracy is increased. Load dumps may conceivably be avoided.

In one desirable further development of the present invention, permanently defined current profiles or power profile are stored for specific maneuvers, the current profile or power profile likely applied to the energy accumulator being determined as a function of the permanently defined current profiles or power profiles. The calculation is thereby simplified or accelerated, as no further components have to supply data.

In one useful further development of the present invention, the model receives sensor data, particularly from the vehicle control. As a result, accuracy in the use of a model may be further increased.

In one expedient further development of the present invention, the model of the vehicle electrical system receives the line resistances, particularly from a wiring-harness diagnosis. The accuracy of the system is thereby increased, as aging effects are also taken into account in updated line resistances.

In one practical further development of the present invention, a power distributor is provided, via which the safety-related electrical consumer is protected and which is connected to the energy accumulator. All data relevant for monitoring the vehicle electrical system may be gathered in this power distributor, since special protection of the safety-related electrical consumers by fusing is carried out there in any case, utilizing particularly precise predictions.

In one useful further development of the present invention, the power distributor includes at least one switching means for disconnecting one branch of the vehicle electrical system having the safety-related electrical consumer from another branch of the vehicle electrical system that supplies energy to an electrical consumer not related to safety. Negative effects of other branches of the vehicle electrical system on the supply of the safety-related electrical consumer may be prevented via this switching means, and the availability of the safety-related electrical consumers is thus increased.

In one expedient further development of the present invention, a voltage is used as predicted characteristic quantity of the safety-related electrical consumer. As a result, possible functional restrictions may be predicted particularly simply, and in addition, are easy to ascertain via the model of the vehicle electrical system.

Additional expedient developments of the present invention are derived from the disclosure herein.

DETAILED DESCRIPTION OF EXAMPLE EMBODIMENTS

The present invention is represented schematically on the basis of an exemplary embodiment, and is described in detail in the following with reference to the figures.

Figure 1:
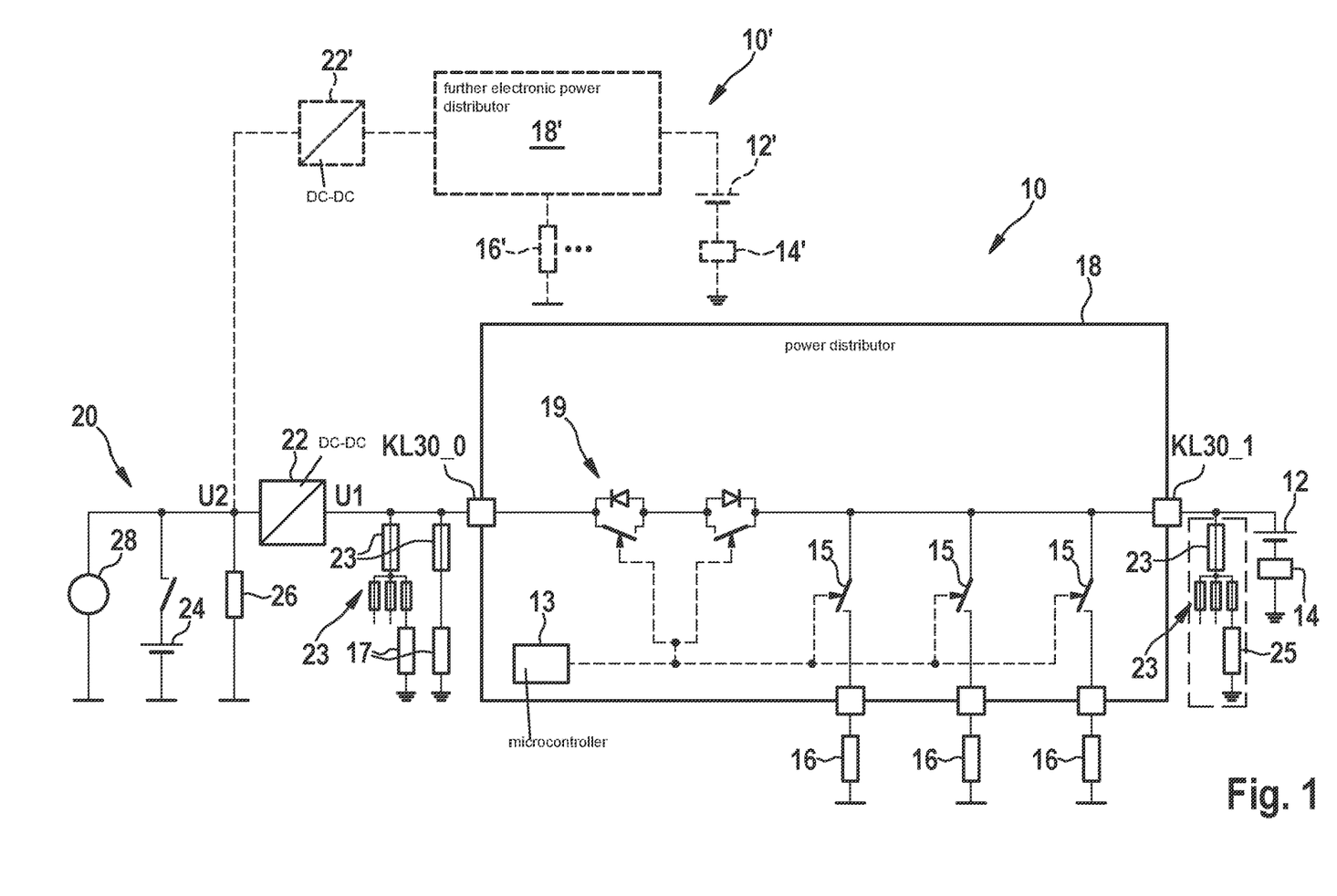
FIG. 1 shows a vehicle electrical system.

FIG. 1 shows one possible topology of an energy supply system, made up of a vehicle electrical system 10 which includes an energy accumulator 12, particularly a battery 12 with associated sensor 14, preferably a battery sensor, as well as several, especially safety-related electrical consumers 16 which are protected and driven by an electric power distributor 18. Electrical consumers 16 are special consumers having high requirements, that is, a high need for protection, generally referred to as safety-related electrical consumers 16. For example, they include an electric steering system and/or a brake system as components which must absolutely be supplied with energy in order to ensure the steering and/or braking of the vehicle in the case of a fault. To that end, corresponding characteristic quantities of particular electrical consumer 16 are acquired separately, and in response to a deviation from tolerable values, the applicable switch 15 is opened to protect electrical consumer 16 in question.

Energy accumulator 12 is likewise connected to a terminal (connection terminal KL30_1) of power distributor 18. Sensor 14 is able to sense an electric characteristic quantity such as a voltage Ub at energy accumulator 12 and/or a current Ib through energy accumulator 12 and/or a temperature Tb of energy accumulator 12. For example, from electric characteristic quantities Ub, Ib, Tb ascertained, sensor 14 is able to determine the state of charge SOC of energy accumulator 12 and or further characteristic quantities of energy accumulator 12. At further terminal (KL 30_1) of power distributor 18, to which energy accumulator 12 is also connected, optionally a further supply branch is provided for at least one further electrical consumer 25, as well. Optional electrical consumer 25 may be protected via a safety fuse 23. Additional electrical consumers 25 may also be provided, which likewise may be protected via safety fuses 23. These electrical consumers 25 are of the sort which, even upon interruption or opening of switching means 19 in power distributor 18, should still be supplied with energy by energy accumulator 12, thus, preferably are safety-critical electrical consumers 25, that is, electrical consumers 25 which are critical with respect to the generating of disturbances in terms of the security of supply. Thus, an (optional) safety-related or safety-critical vehicle-electrical-system path is connected to terminal KL 30_1.

Power distributor 18 is capable of ascertaining corresponding characteristic quantities such as voltage Uv and current Iv of electrical consumers 16. Moreover, power distributor 18 is likewise capable of determining corresponding characteristic quantities of energy accumulator 12, such as voltage Ub and/or current Ib and/or temperature Tb. Power distributor 18 contains the appropriate sensors for that purpose. Power distributor 18 likewise has appropriate processing means such as a microcontroller 13, for example, to store and/or evaluate acquired variables. In addition, microcontroller 13 is capable of controlling corresponding switches 15, that is, switching means of switching means 19 (disconnectors having high-current capability). Alternatively, the evaluation could also be carried out in another control unit.

For example, electrical consumers 16 supplied by way of power distributor 18 could include safety-related vehicle functions such as braking, steering, etc., especially electrical consumers 16 having high requirements in terms of the need for protection. In general, safety-related electrical consumers 16, 25 are consumers especially worthy of protection, which are necessary to maintain certain emergency functions, for example. In addition to the functions such as steering and braking described, they may also be functions which, for instance, if possible, should still be functional after an accident, such as, e.g., restraint systems, locking systems for opening and closing the vehicle doors, emergency call systems, e.g., for transmitting an electronic emergency call, sunroof functions, lighting or the like.

Base vehicle electrical system 10 has a lower voltage level U1 compared to a high-voltage vehicle electrical system 20, for example, it may be a 14-V vehicle electrical system. A DC-DC converter 22 is disposed between base vehicle electrical system 10 and high-voltage vehicle electrical system 20. For instance, high-voltage vehicle electrical system 20 includes an energy accumulator 24, e.g., a high-voltage battery, possibly with integrated battery management system, a load 26 shown by way of example, e.g., a comfort and convenience electrical consumer such as an air conditioner, etc., supplied with raised voltage level, as well as an electric machine 28. Understood as high voltage in this connection is a voltage level U2 which is higher than voltage level U1 of base vehicle electrical system 10. Thus, it could be a 48-volt vehicle electrical system, for example. Alternatively, voltage levels could be even higher, especially in the case of vehicles with electric drive. Alternatively, high-voltage vehicle electrical system 20 could be omitted completely.

Disposed between terminal (KL30_0) of power distributor 18 and DC-DC converter 22 is a further branch, that is, a further partial vehicle electrical system for supplying further electrical consumers 17. Respective electrical consumers 17 are protected via corresponding safety fuses 23, as illustrated by way of example. These electrical consumers 17 are typically comfort and convenience consumers, that is, electrical consumers not related to safety. Comfort and convenience electrical consumers 17 and safety fuses 23 may be divided into main groups and subgroups, and thereby grouped depending on usages. They are electrical consumers 17 which are not characterized by high safety relevance (like electrical consumers 25) or by high requirements with respect to the need for protection (like electrical consumers 16). Effects of these electrical consumers 17 on safety-related electrical consumers 25 and/or 16 may be prevented through isolation of the fault by opening switching means 19. Switching means 19 are thus situated between electrical consumers 17 and safety-related electrical consumers 25 and/or electrical consumers 16 with high need for protection.

At least one or more, especially safety-related channels or vehicle-electrical-system branches 10' may be connected to high-voltage vehicle electrical system 20 via a further DC-DC converter 22'. The safety-related channels could in each case have a further electronic power distributor 18'. Optionally, further power distributor 18' may also be connected directly, without further DC-DC converter 22', to the same terminal KL30_0 as power distributor 18. Further electronic power distributor 18' could be used for the protection by fusing, the control, and the safe and reliable disconnection of safety-related electrical consumers 16' or of the electronic energy network distribution. These electrical consumers 16' could be designed to be functionally redundant relative to those electrical consumers 16 which are supplied by a different safety-related branch of vehicle electrical system 10. In addition, further electronic power distributor 18' may be capable of determining the flowing consumer currents or applied voltages. This briefly described, optional implementation could be provided for a redundant design, e.g., for autonomous driving in order to increase safety. A further energy accumulator 12' together with a further sensor 14' could also be provided in the further branch of the vehicle electrical system.

A battery or accumulator is described by way of example as possible energy accumulator 12, 24 in the exemplary embodiment. Alternatively, however, other energy accumulators suitable for this task definition on inductive or capacitive basis, for example, fuel cells, capacitors or the like may be used in the same way.

Figure 2:
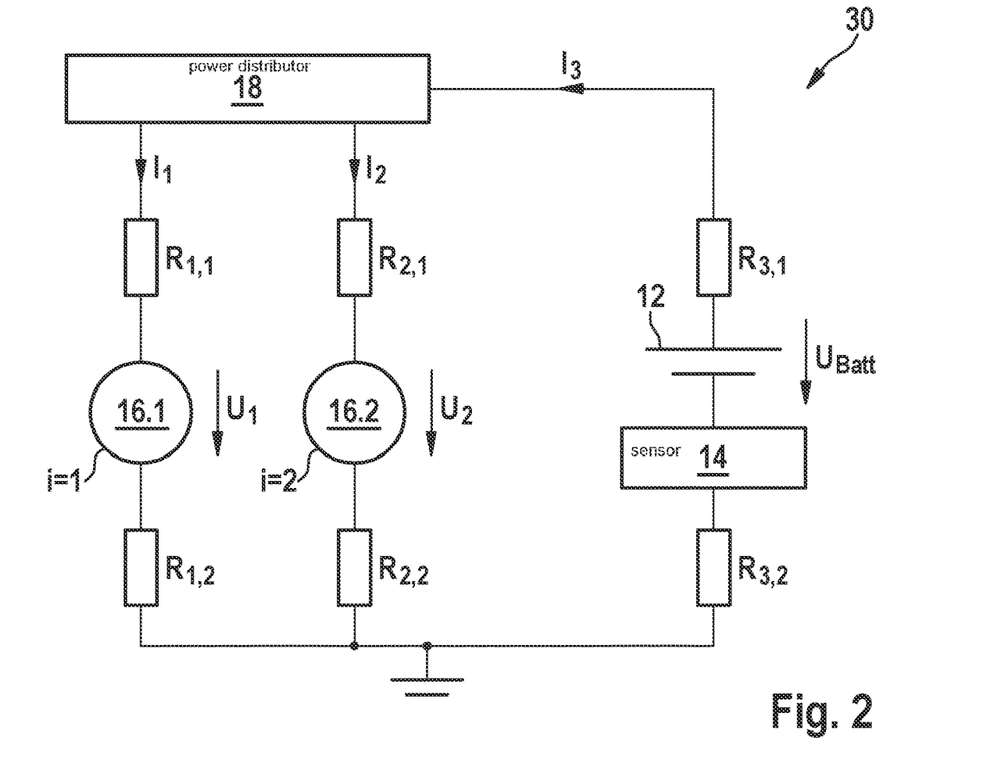
FIG. 2 shows a simplified model of a vehicle electrical system.

FIG. 2 shows a simplified model 30 of a vehicle electrical system. As an example, it is made up of two (i=2) safety-related electrical consumers (16$i$) 16.1,16.2, each of which is supplied by power distributor 18, as also illustrated in greater detail in FIG. 1. A current I1 flows through the one electrical consumer 16.1, a further current I2 flows through the other electrical consumer 16.2. A first voltage U1 drops off at the one electrical consumer 16.1, a further voltage U2 drops off at the other electrical consumer 16.2. Resistors R1,1, R1,2 represent the wiring-harness resistances in the branch of the one electrical consumer 16.1, resistors R2,1, R2,2 represent the wiring-harness resistances or line resistances in the branch of the other electrical consumer 16.2. Energy accumulator 12 with voltage Ub feeds power distributor 18 with a current I3. Resistors R3,1, R3,2 also provided in the branch of energy accumulator 12 represent the associated wiring-harness resistances or line resistances of this branch. Not shown explicitly in model 30 of the vehicle electrical system are electrical consumers 17, which likewise load energy accumulator 12 via the base load (status 40), and therefore also go into the ascertainment of predicted output voltage Up_b. For example, predicted voltage Up_b could be determined by sensor 14, which could include a model of energy accumulator 12. According to FIG. 3, generally a block 32 is provided for monitoring energy accumulator 12, which determines predicted output voltage Up_b and, for instance, passes on minimum output voltage Ubmin to vehicle-electrical-system model 30 or to a monitoring block 34 in which model 30 of the vehicle electrical system is implemented.

Three factors are essential for a prediction of terminal voltage Ui at respective safety-related electrical consumers 16$i$. The predicted or assumed power profile Lp or Lpges in the form of a current profile is made up of current profile Lp$i$ of electrical consumers 16$i$ which is/are needed for the driving maneuver, and the current profile of the base load of electrical consumers 17, which do not have to be safety-related (for example, computer for highly automated driving (for this an undervoltage is critical, the computer is supplied regardless of the driving situation and draws approximately the same amount of current), seat heating, etc.). The entire predicted power profile Lpges of all electrical consumers 16$i$ needed especially for the specific maneuver together with base load 40 of electrical consumers 17 that are not safety-related is converted into a predicted current profile Ib_p 50, which energy accumulator 12 must make available. This predicted current profile Ib_p of energy accumulator 12 is used to predict voltage Ub_p of energy accumulator 12. For example, the prediction of voltage Ub_p of energy accumulator 12 is furnished by a monitoring block 32 or sensor 14 which, for instance, resort to a model of energy accumulator 12 for this purpose. In particular, a minimum predicted voltage Ub_min of energy accumulator 12 is determined and compared to a limit value, and if there is a drop below this limit value, a critical state of vehicle electrical system 10 would be assumed.

Depending on the type (ohmic, power-dependent, voltage-dependent) of electrical consumer 16, 17, the entire current profile of the collective safety-related electrical consumers 16 is converted into individual current profiles 70$i$ (Ix) of individual safety-related electrical consumers 16$i$. These are added up accordingly utilizing a nodal approach.

Resistance Rx of the corresponding line or of the corresponding branch must be known. It may either be assumed as a constant value or may be determined, e.g., via a wiring-harness diagnosis 36 or wiring-harness model. With the aid of predicted minimum voltage Ubmin at energy accumulator 12, resistances Rx and respective current profiles Ix 70$i$, it is possible to determine voltage drop (Rx*Ix) over the lines. In doing so, if appropriate, base load 40 of electrical consumers 17 not related to safety in a further branch of the model of the vehicle electrical system together with associated resistances is likewise taken into account.

At a certain load which occurs in the case of a certain maneuver for transferring the vehicle into a safe standstill, specific current Ii or Ix through the line in question or voltage Ui dropping at specific electrical consumer 16i may be predicted via model 30 of the vehicle electrical system according to the formula:

$$U_i(t) = U_{batt}(t) - \sum_x (R_x * I_x(t))$$

where Ui is the voltage at specific, especially safety-related electrical consumer 16i, 17
Ubatt is the voltage at energy accumulator 12 (or Ub_p)
Rx is the relevant line resistance
Ix is the predicted current through the relevant line.

Thus, for example, voltage U1 at electrical consumer 16.1 (such as a steering system, for example) is determined via the equation $U1=Ubatt-I3*(R31+R32)-I1*(R11+R12)$ The combination of a diagnosis of energy accumulator 12, a wiring-harness diagnosis or ascertainment of the corresponding parameters via model 30 of the vehicle electrical system and the prediction or determination of the power profile or current profile 64 Ix of the particularly safety-related electrical consumers 16 is essential. The diagnosis of energy accumulator 12 furnishes predicted terminal voltage Ub_p of energy accumulator 12 as output quantity, if electrical consumers 16 were to consume current profile 64 predicted or requested by vehicle control 60. A wiring-harness diagnosis determines the respective wiring-harness resistances or line resistances Rx. The function may generate a prediction about the future power profile or current profile 64. The future power profile or current profile 64 is dependent on the particular driving maneuver called for (e.g., full braking, double lane change, etc.), the vehicle environment (e.g., weather, route) as well as the electrical consumers 16, 17 that are active (e.g., seat heating, infotainment, computer for the highly automated driving, etc., in the form of base load 40). For instance, if an undervoltage is predicted at a safety-related electrical consumer 16 (Ui<Umin), measures 44 may be taken against that. Their effectiveness on its adequacy may be checked again, as already described, with the aid of the predicted power profile or current profile 64, which may have been changed because of the measures introduced.

Figure 3:
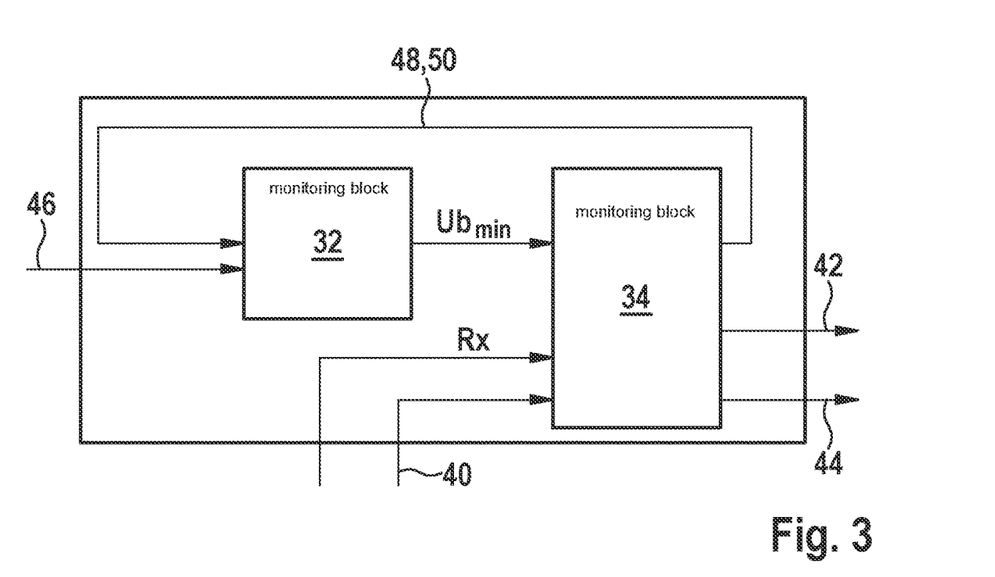
FIG. 3 shows a structure of the functional event chain.

FIG. 3 shows a schematic overview of the interacting components for monitoring safety-related electrical consumers 16. Monitoring block 32 of energy accumulator 12 receives or includes parameters 46 of energy accumulator 12 as used, for example, for modeling energy accumulator 12. In addition, for example, monitoring block 32 receives corresponding actual values of energy accumulator 12, such as voltage Ub and/or current Ib and/or temperature Tb. They could be made available by sensor 14, for instance, especially a battery sensor. In addition, monitoring block 32 receives information with respect to discharge 48 or power profile Lpges (e.g., via corresponding current profiles in typical scenarios) and/or a current profile 50, e.g., a maximum current which will likely be applied to energy accumulator 12. Utilizing a suitable model for energy accumulator 12, monitoring block 32 of energy accumulator 12 determines a characteristic quantity for energy accumulator 12 like, for example, a predicted minimum voltage Ub_min which could be expected to be obtained at energy accumulator 12 in the case of the corresponding load. This characteristic predicted quantity Ub_min arrives at a monitoring block 34 of vehicle electrical system 10 along with wiring-harness resistances Rx as well as status information 40 of different electrical consumers 16, 17 (for example, the base load and/or information as to which electrical consumers 16, 17 are active, from which the base load is able to be determined). From this, monitoring block 34 determines input quantities 42 for a vehicle control 60 and/or determines measures 44 to be initiated.

Figure 4:
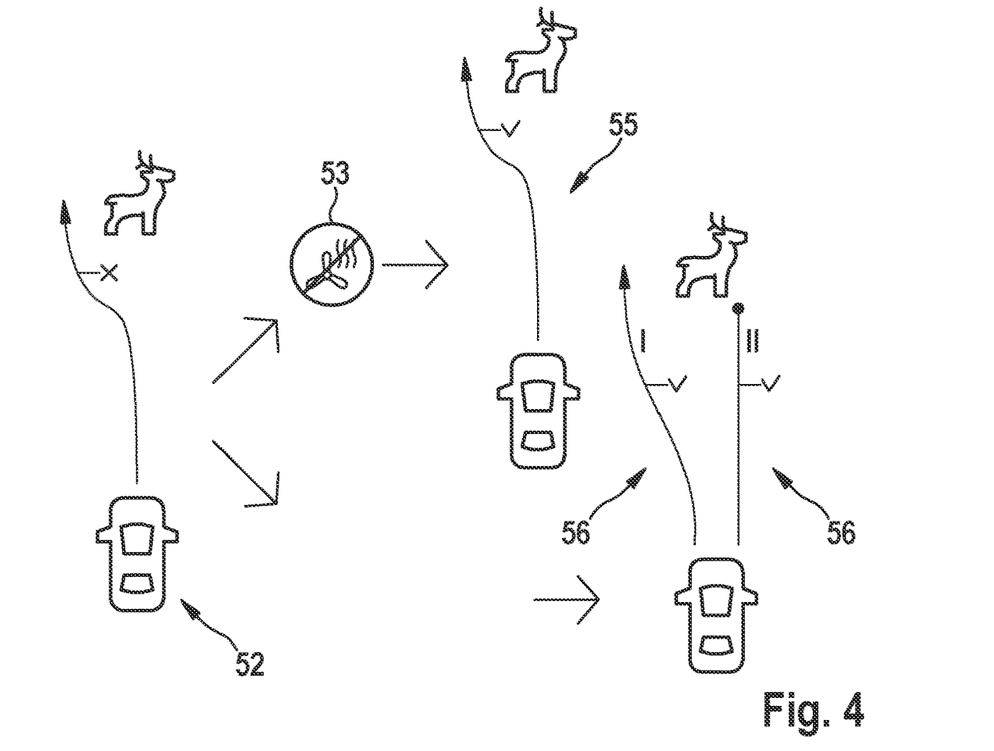
FIG. 4 shows different maneuvers of a vehicle.

FIG. 4 shows pictorially how a vehicle indeed foresees a planned maneuver 52 which, however, cannot be carried out in the planned form because of critical limit values in the case of associated safety-related electrical consumer 16. For example, as a measure 44, monitoring block 34 could then initiate a shutdown 53 at least of a base load, that is, of electrical consumers 17 not related to safety. The result may be that although with the base load switched off, however while maintaining the permissible voltage limit values for safety-related electrical consumer 16, planned maneuver 52 can really actually be carried out (in the form of a maneuver 55 after shutting down the base load). Alternatively, planned maneuver 52 could be carried out as adjusted maneuver 57 in slightly modified manner (e.g., by gentler steering which would lead to a lower demand for energy, thus resulting potentially in observance of the permissible limit values of safety-related electrical consumer 16). Alternatively, planned maneuver 52 could be executed in the form of an altered maneuver 56. As an example, in the exemplary embodiment, the intention was not to get around the obstacle (originally planned maneuver 52), but rather to brake in time (altered maneuver 56). In this context, the demand for energy or the associated requested current profile 64 of altered maneuver 56 is selected in such a way that the permissible limit values (especially voltage limit values) of safety-related electrical consumer 16, (e.g., in this case a brake system) are observed.

Figure 5:
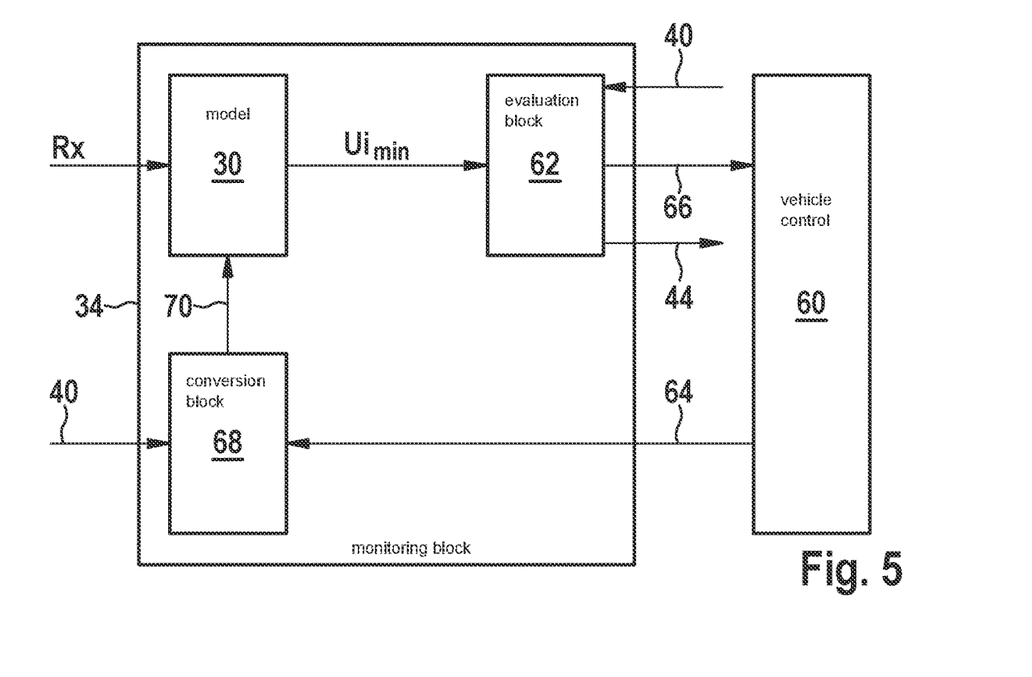
FIG. 5 shows a first exemplary embodiment of a monitoring of a vehicle electrical system, in accordance the present invention

The exemplary embodiment according to FIG. 5 is particularly suitable for an automation level 3 or more (defined according to SAE J3016). In this case, vehicle control 60 generates a current profile 64 based on a planned driving maneuver 52 and associated trajectories. This current profile 64 (initially only requested by vehicle control 60) is a prediction of the future load for individual electrical consumers 16, 17. Monitoring block 34 includes a conversion block 68 which makes individual current profiles 70 Ix for each line or branch in the vehicle electrical system, e.g., the respective maximum current for the respective branch, available to model 30 of the vehicle electrical system. Vehicle-electrical-system model 30 is likewise part of monitoring block 34. For example, it receives as input quantities—or else predicts, e.g., by way of sensor 14 itself—a minimum voltage of energy accumulator Ub_min as was predicted within the framework of a simulation utilizing a model of energy accumulator 12 and corresponding load profiles. In addition, vehicle-electrical-system model 30 receives respective wiring-harness resistances Rx. From this, it is possible to calculate the voltage drop over the lines, possibly also taking into account the base load of electrical consumers 17 not related to safety. Utilizing the quantities supplied, particularly minimum voltage Ub_min of energy accumulator 12 to be expected and respective current profiles 70 for the respective lines, vehicle-electrical-system model 30 determines the minimum characteristic quantities or consumer voltages Ui min for respective safety-related electrical consumers 16i. These terminal voltages Ui at the different electrical consumers 16i are evaluated in a block 62. In this context, depending on the existing possibility, one or more measures 44 may be taken or corresponding information 66 concerning the feasibility of maneuver 52 may be reported back to vehicle control 60. Vehicle control 60 may thereupon request an altered current profile 64 based on a trajectory changed in vehicle control 60 or a maneuver 54 adjusted compared to planned maneuver 52 or an altered maneuver 56. Thus, the function is only carried out if a request (requested load profile 64) is made by vehicle control 60. Several iteration loops with vehicle control 60 may be necessary.

Figure 6:
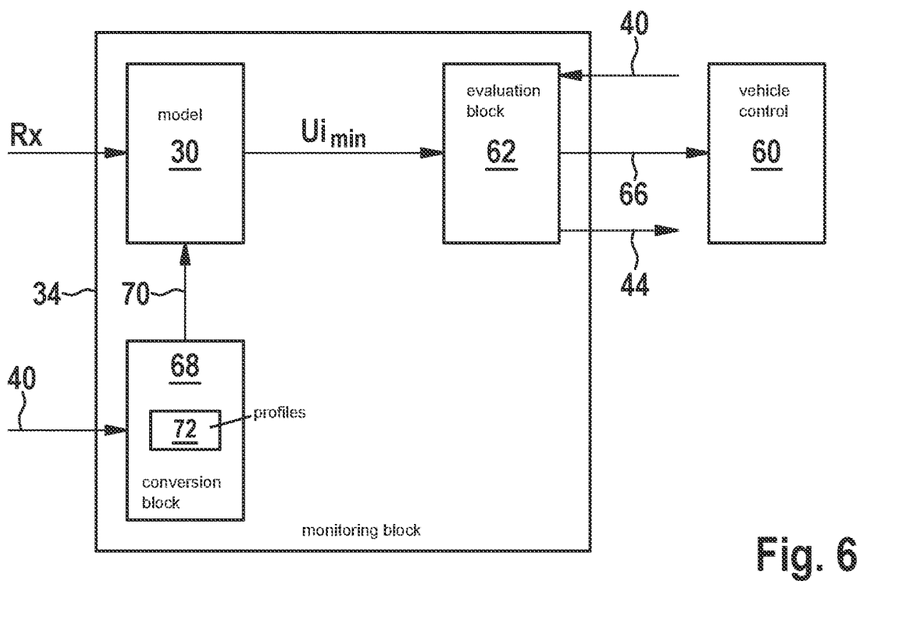
FIG. 6 shows a second exemplary embodiment of a monitoring of a vehicle electrical system, in accordance with the present invention.

In the exemplary embodiment according to FIG. 6, permanently defined current profiles 72 are now stored in monitoring block 34. These permanently defined current profiles 72 correspond to permanently defined maneuvers 52 in the worst case (e.g., a full braking). With the aid of these current profiles 72, it is now possible to predict voltage Ui at safety-related electrical consumers 16i. This is carried out essentially in accordance with the exemplary embodiment according to FIG. 5. Once more, conversion block 68 is used to convert permanently defined current profiles 72 into current profiles 70 Ix for each line or into current profile 50 for energy accumulator 12, again as a function of respective status 40 of electrical consumers 16, 17. If necessary, this may be repeated for each permanently defined current profile 72, and associated voltage Ui at respective safety-related electrical consumer 16i may be predicted. Evaluation block 62 now gives a reply or information 66 concerning the feasibility of the maneuver for each permanently defined current profile 72 as to which driving maneuvers 52 are executable, to vehicle control 60. To that end, for example, particular voltage Ui at safety-related electrical consumer 16i may be compared in evaluation block 62 to a specific limit value for electrical consumer 16i in question, and countermeasures may be triggered, for instance, in response to a drop below a minimum voltage. For example, due to an increased line resistance Rx with respect to the braking system, a braking maneuver may become critical. Thus, the worst case driving maneuvers are blocked owing to their corresponding current profiles. Measures 44 are taken without consideration of vehicle control 60. The function is carried out cyclically, so that the output is always matched to the instantaneous state of vehicle electrical system 10. Certain maneuvers 52 are thereby blocked to vehicle control 60, so that the trajectory may only be generated from a permissible maneuver.

Figure 7:
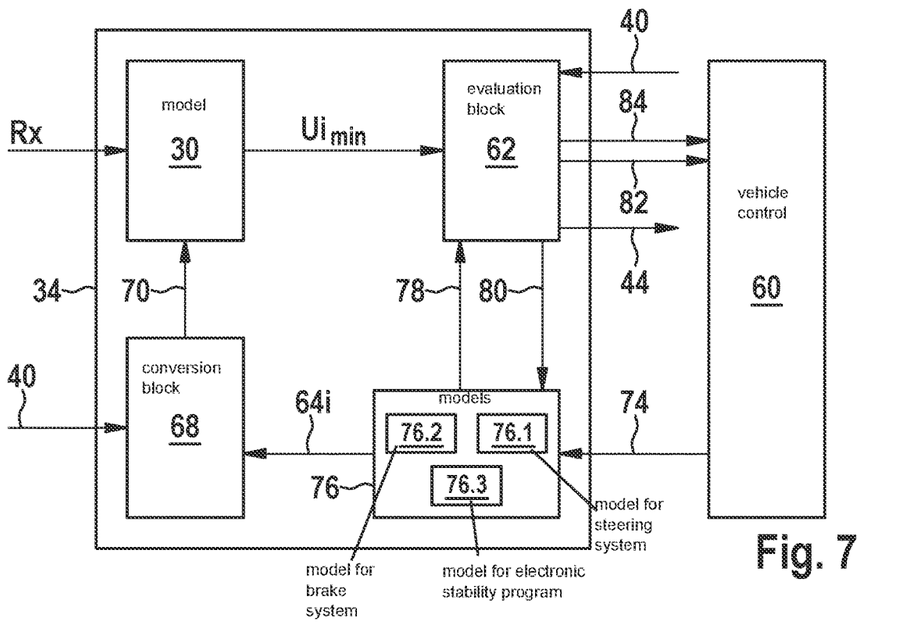
FIG. 7 shows a third exemplary embodiment of a monitoring of a vehicle electrical system, in accordance with the present invention.

The exemplary embodiment according to FIG. 7 is characterized in that monitoring block 34 includes models 76 of safety-related electrical consumers 16. For example, a model 76.1 for the steering system, a model 76.2 for a brake system as well as a model 76.3 for an electronic stability program are stored. Models 76 are populated with sensor data 74 from vehicle control 60. Thus, a maximum current is calculated as example for a current profile 64i for various possible driving maneuvers in various environmental situations. In an alternative simplification, models 76 could be replaced by corresponding look-up tables. As already described previously in the exemplary embodiments, respective voltages Ui may be calculated at associated electrical consumers 16i. Vehicle control 60 is subsequently informed as to which driving maneuvers 84 or which associated parameters of these driving maneuvers may be called up. In addition, a response in the form of a result 80 is given back by evaluation block 62 to model 76. Moreover, models 76 pass on assumed driving maneuvers 78 or assumed current profiles 64i of electrical consumers 16i to evaluation block 62. In addition, models 76 may be considered with adjusted current profiles of electrical consumers 16, and a voltage Ui may again be calculated at electrical consumers 16. This variation guarantees that possible maneuvers 52 or possible load profiles are always made known.

With the aid of load profiles 84 (driving maneuvers, torque profiles for each component), boundary conditions for a trajectory planning as could be realized in vehicle control 60 are predetermined by evaluation block 62. In this way, a trajectory may be generated in keeping with the state of the vehicle electrical system. In so doing, the trajectory is only allowed to be generated within the given boundary conditions as predetermined by evaluation block 62 and communicated to vehicle control 60. Vehicle control 60 is able to test possible future environmental parameters by manipulating sensor data 74. Thus, vehicle control 60 is constantly given feedback as to which driving maneuvers 52 are possible. For example, as an additional measure, the vehicle speed may be reduced and/or the automated driving functions may be ended, as made known via signal 82. If necessary, the measure is then implemented in vehicle control 60.

It is especially preferred that monitoring 34 described be realized in load (power) distributor 18. This is so advantageous because all relevant quantities as described are present in load (power) distributor 18. This is especially favorable for a possible comparison of predicted characteristic quantities and actual characteristic quantities.

What is claimed is:

1. A method for monitoring an electrical system of a motor vehicle, at least one safety-related electrical consumer being supplied by an energy accumulator, at least one model of the electrical system of the motor vehicle being provided which represents the safety-related electrical consumer and corresponding lines with associated line resistances and connection to the energy accumulator, the method comprising the following steps:

providing a current profile or power profile that will likely be necessary at least for one specific maneuver of the motor vehicle involving the safety-related electrical consumer;

determining a predicted characteristic quantity of the energy accumulator utilizing the provided current profile or the provided power profile;

determining a predicted characteristic quantity of the safety-related electrical consumer utilizing a current profile or a power profile which is expected to be applied to the safety-related electrical consumer, the associated line resistance, and the predicted characteristic quantity of the energy accumulator; and evaluating the predicted characteristic quantity of the safety-related electrical consumer.

2. The method as recited in claim 1, wherein further electrical consumers are supplied by the energy accumulator.

3. The method as recited in claim 1, wherein the current profile or the power profile that will likely be necessary at least for the one specific maneuver of the motor vehicle involving the safety-related electrical consumer includes a base load of at least one further electrical consumer.

4. The method as recited in claim 1, based on the predicted characteristic quantity of the safety-related electrical consumer dropping below a limit value: denying enabling of the one specific maneuver and/or adjusting the one specific maneuver and/or generating corresponding information concerning feasibility of the one specific maneuver.

5. The method as recited in claim 1, further comprising:

receiving a requested current profile or requested power profile requested by a vehicle control for the one specific maneuver;

processing the requested current profile or power profile:
(i) to obtain a current profile or power profile to be provided by the energy accumulator, and/or (ii) to obtain a current profile or power profile for each line which supplies the safety-related electrical consumer involved in the one specific maneuver.

6. The method as recited in claim 1, wherein at least one model of the safety-related electrical consumer is provided via which a current profile or power profile of the safety-related electrical consumer is assessed in the case of different maneuvers.

7. The method as recited in claim 1, wherein the provided current profile or the provided power profile is determined as a function of a status of the safety-related electrical consumer.

8. The method as recited in claim 1, wherein permanently defined current profiles or power profiles are stored for certain maneuvers, a specific current profile or power profile likely applied to the energy accumulator and the lines being permanently defined as a function of a driving maneuver.

9. The method as recited in claim 1, wherein sensor data are transmitted to the model.

10. The method as recited in claim 9 where the sensor data are transmitted by a vehicle control.

11. The method as recited in claim 1, wherein the model of the vehicle electrical system receives the associated line resistances from a wiring-harness diagnosis.

12. The method as recited in claim 1, wherein a power distributor is provided, via which the safety-related electrical consumer is protected by fusing, and which is connected to the energy accumulator.

13. The method as recited in claim 12, wherein the power distributor includes at least one switch configured to disconnect one branch of the vehicle electrical system having the safety-related electrical consumer from another branch of the vehicle electrical system that supplies energy to an electrical consumer not related to safety.

14. The method as recited in claim 1, wherein a voltage is used as the predicted characteristic quantity of the safety-related electrical consumer.

15. The method as recited in claim 1, wherein measures are taken as a function of the predicted characteristic quantity of the safety-related electrical consumer.

* * * * *